United States Patent
Hsu et al.

(10) Patent No.: US 7,171,325 B2
(45) Date of Patent: Jan. 30, 2007

(54) METHOD AND SYSTEM FOR WIDEBAND DEVICE MEASUREMENT AND MODELING

(75) Inventors: Yung-Jane Hsu, Hsinchu (TW); Ming-Hsiang Chiou, Hsinchu (TW)

(73) Assignee: Frontend Analog and Digital Technology Corporation, Taipei (TW)

( * ) Notice: Subject to any disclaimer, the term of this patent is extended or adjusted under 35 U.S.C. 154(b) by 167 days.

(21) Appl. No.: 10/898,508

(22) Filed: Jul. 22, 2004

(65) Prior Publication Data
US 2006/0020410 A1 Jan. 26, 2006

(51) Int. Cl.
*G01R 31/00* (2006.01)
(52) U.S. Cl. .................. 702/120; 702/106; 702/126
(58) Field of Classification Search ............... 702/106, 702/120, 126
See application file for complete search history.

(56) References Cited

U.S. PATENT DOCUMENTS

2005/0137811 A1* 6/2005 Hsu et al. ..................... 702/57
2005/0248482 A1* 11/2005 Goodman et al. .......... 342/180

OTHER PUBLICATIONS

Joel Dunsmore, "Measuring and modeling package interconnects using vector network analyzers and time domain transforms", Dec. 1998, IEEE, ARFTG Conference Digest, pp. 107-127.*

* cited by examiner

*Primary Examiner*—John Barlow
*Assistant Examiner*—Cindy D. Khuu
(74) *Attorney, Agent, or Firm*—Sughrue Mion, PLLC; Joseph Bach

(57) ABSTRACT

The method for wideband device measurement and modeling includes: measurement of an electronic device to obtain a set of time domain raw data representing characteristics of said device; conversion of said time domain raw data into frequency domain raw data; calibration and correction of embedded errors according to said frequency domain raw data to obtain clean frequency domain data representing characteristics of said device; conversion of said frequency domain data into time domain clean data; and establishment of equivalent model of said device according to said time domain data. The time domain raw data are obtained by applying to said device an ultra short impulse and measuring said impulse and its response from said device. Conversion between said time domain data and said frequency domain data may be Fourier transform.

12 Claims, 8 Drawing Sheets

(a)

(b)

L=0.35 μm
W=100 μm
$V_G$=2V
$V_D$=2V

L=0.35 μm
W=100 μm
$V_G$=2V
$V_D$=2V

METHOD AND SYSTEM FOR WIDEBAND DEVICE MEASUREMENT AND MODELING

FIELD OF THE INVENTION

The present invention relates to method and system for measurement and modeling of electronic devices, especially to method and system for measurement and modeling of the wideband characteristics of devices, and more specifically, to method and system for measurement and establishment of equivalent model of electronic devices using ultra short impulses.

BACKGROUND OF THE INVENTION

Correct modeling of electronic devices is deemed fundamental for integrated circuit (IC) design. The IC design flow starts with the device measurement and modeling. The modeling results are then used for analog, digital, or mixed signal circuit design. When the silicon measurement results are different from simulation results, designers would return to circuit design modification and simulation and initiate further fabrication of the IC. Incorrect models cannot assure proper design. Any unsuccessful iteration of the flow will bring about the increase of cost. Today's challenges in device modeling lie in the categories that can be classified into ultra high-frequency response, nonlinear response, transient (wideband) behavior and single and unified model.

In order to meet the different features of different devices, separate technologies were developed to model a variety of devices. Empirical models based on DC and temperature measurements are usually adapted for resistors. For capacitors, the overlap, line-to-line and fringe capacitances are measured by a small ac signal with 100 KHz to 1 MHz, and the unit capacitances could be extracted for calculation. An equivalent circuit model extracted from measured S parameters is used for spiral inductors. An active device usually has a physical model extracted by DC, CV, temperature and noise measurements, such as BSIM model for MOSFET and Gummel Poon model for BJT. For device package model, the S parameter measurement is used in the equivalent circuit model extraction. These models may be workable for low frequency, low bit rate, and low accuracy designs. However, they can not meet the wideband, ultra high-frequency, high-speed, nonlinear design needs. In addition, it is inconvenient to use different technologies in the measurement and modeling of different devices.

It is thus necessary to provide a novel modeling method for electronic devices that can be applied to wideband, ultra high-frequency, high-speed and nonlinear designs.

It is also necessary to provide a method for measurement and modeling of electronic devices that can be used in a wide variety of devices.

OBJECTIVES OF THE INVENTION

The objective of this invention is to provide a novel modeling method for electronic devices that can be applied to wideband, ultra high-frequency, high-speed and nonlinear designs.

Another objective of this invention is to provide a method for measurement and modeling of electronic devices that can be used in a wide variety of devices.

Yet another objective of this invention is to provide a method for measurement of the wideband characteristics and establishment of the equivalent model of electronic devices using ultra short impulses.

Another objective of this invention is to provide a method for correct measurement and modeling of electronic devices.

Another objective of this invention is to provide a system for measurement and modeling of electronic devices using the above methods.

SUMMARY OF THE INVENTION

According to the present invention, the method for wideband device measurement and modeling comprising: measurement of an electronic device to obtain a set of time domain raw data representing characteristics of said device; conversion of said time domain raw data into frequency domain raw data; system calibration and correction of embedded errors according to said frequency domain raw data to obtain frequency domain clean data representing characteristics of said device; conversion of said frequency domain clean data into time domain clean data; and establishment of equivalent model of said device according to said time domain clean data. In the present invention, the time domain taw data are obtained by applying to said device an ultra short impulse and measurement of said impulse and its response from said device. In addition, conversion between said time domain data and said frequency domain data may be performed by using the Fourier Transform. This invention also discloses system for wideband device measurement and modeling using the above method.

These and other objectives and advantages of this invention may be clearly understood from the detailed description by referring to the following drawings.

DETAILED DESCRIPTION OF THE INVENTION

Although it is not intended to limit the scope of this invention, it is found that, if the equivalent model of an electronic device is able to faithfully describe an ultra short time domain response, the model shall conform the requirements in the wideband, nonlinear and ultra high-frequency considerations of the device. In the present invention, an ultra short impulse with duration of less than 100 ps is applied to the electronic device to be measured. The ultra short impulse itself and its reflection response and transmission response are measured. The data so obtained are time domain data and are then transformed into frequency domain data. Calibration and removal of embedded errors are conducted using the frequency domain data to obtain clean data representing characteristics of the device. According to this invention the reflection response and the transmission response obtained using the ultra short impulse contain descriptive information of the characteristics of the device that has wide frequency distribution, that includes small to large signals and that is ultra short in time duration. Such information is sufficient to describe the ultra high-frequency, nonlinear and wideband behavior of the device. Correct equivalent model of the device may thus be established using such information.

In addition, the model as established by the present invention may be an extension of a model established according to other modeling technology. In the embodiment of this invention a MOSFET model established using BSIM3v3 is used as basic unit model and extensions are added to that basic unit model according to the invented method.

In using the method and system for wideband device measurement and modeling of this invention, users do not need to replace their high-frequency measurement instruments. They simply need to add an ultra short impulse generator to the existing measurement environment to conduct the invented measurement and modeling method. The invented method and system may be used to measure all kinds of active and passive devices.

Figure 1:
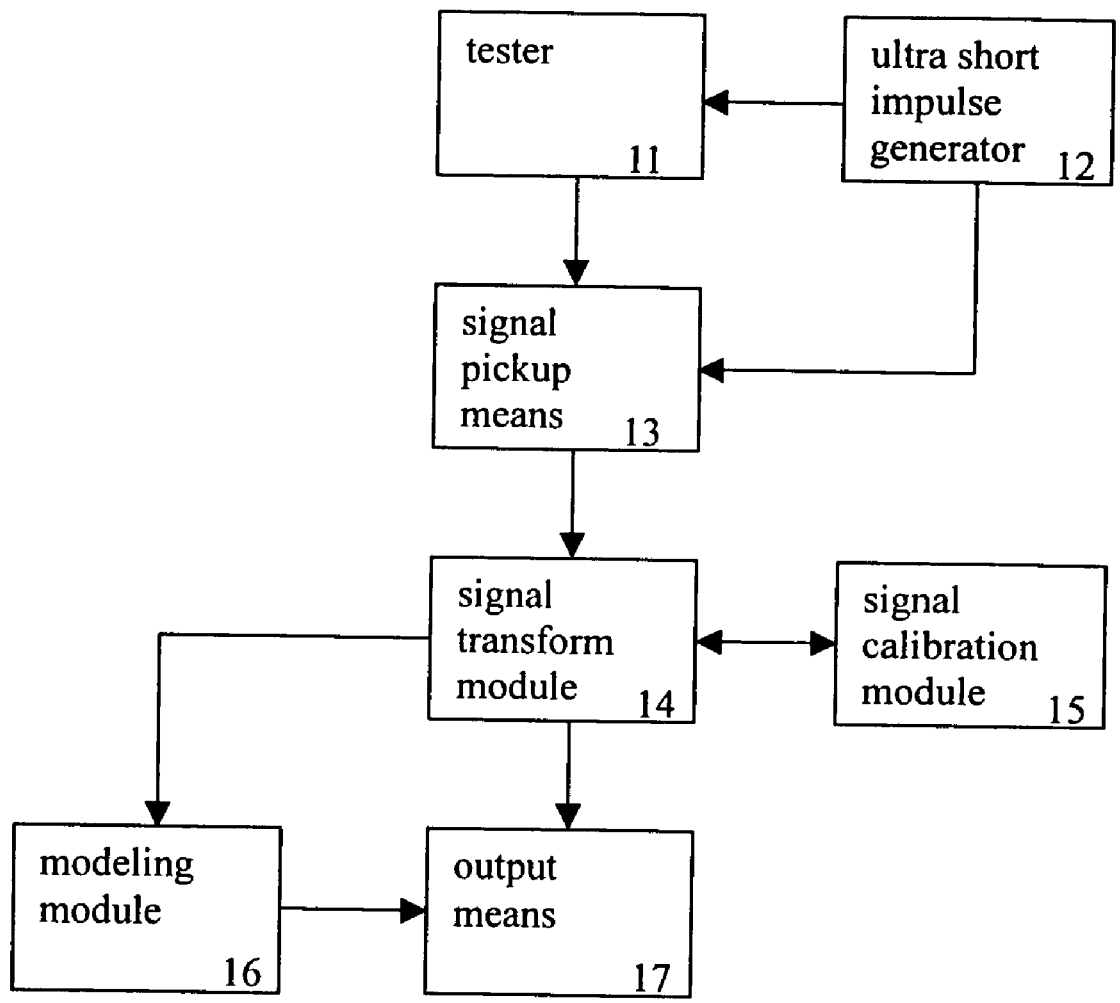
FIG. 1 shows the systematic diagram of the system for wideband device measurement and modeling of this invention.

FIG. 1 shows the systematic diagram of the system for wideband device measurement and modeling of this invention. As shown in this figure, the wideband device measurement and modeling system of this invention comprises: a tester 11 to position a device to be measured, provided with probes and other necessary tooling, to apply an input to said device and in order to measure said input and responses generated by said device in response to said input; an ultra short impulse generator 12 to generate an ultra short impulse to be applied to said device to be measured; a signal pickup means 13 to measure the ultra short impulse as applied to said device and the responses generated by said device, including the transmission response and the reflection response; a signal transform module 14 to transform a signal from its time domain to its frequency domain or from its frequency domain to its time domain; a signal calibration module 15 to calibrate and to de-embed errors from signals measured by said signal pickup means 13; a modeling module 16 to establish equivalent model according to a set of device characteristics data; and an output means 17 to output a set of device characteristics data or a set of information representing the equivalent model of said device.

Among the above modules, the ultra short impulse generator 12 may be any equipment that is able to generate ultra short impulses. Applicable ultra short impulse generators include the commercially impulse generator fabricated by Agilent Technologies, Anritsu Corporation, Tektronix, Inc. etc. As to the signal pickup means 13, it may be any known signal measurement instrument, including any commercially available oscilloscope. The tester 11 may also be any known measurement tool, such as the high frequency probing system fabricated by Cascade Microtech. Since these equipments are well known to those skilled in the art, detailed description thereof is thus omitted.

The impulse generated by the ultra short impulse generator 12 is an impulse with very short duration in the time domain. The duration of the impulse is preferably less than 100 picoseconds (ps) to cover the desired bandwidth, depending on the requirement of applications. In general, an ultra short impulse with about or less than 30 ps width would be sufficient to generate measurement data covering a bandwidth that is wide enough to provide needed information. The rise time and the fall time of the impulse are not limited but are substantially equal. The magnitude of the impulse is preferably tunable such that a variety of measurement requirements may be satisfied. In general, the amplitude of the impulse is modulated within the range between several mV to several V.

When the measurement is conducted, the device to be tested is positioned on the tester and correct connections are arranged. Probes are placed at proper positions. The ultra short impulse generator 12 generates and applies an ultra short impulse to the device. In response to the incident impulse, the signal pickup means 13 measures the incident pulse and the transmitted response and the reflected response from the device. Three waveforms are thus obtained.

The time domain data so obtained are then converted by the signal transform module 14 into frequency domain data. In an embodiment of this invention, the time domain data are converted by the signal transform module 14 using the fast Fourier Transform (FFT) technology. The obtained frequency domain data are provided to the calibration module 15 for calibration and error correction.

Figure 2:
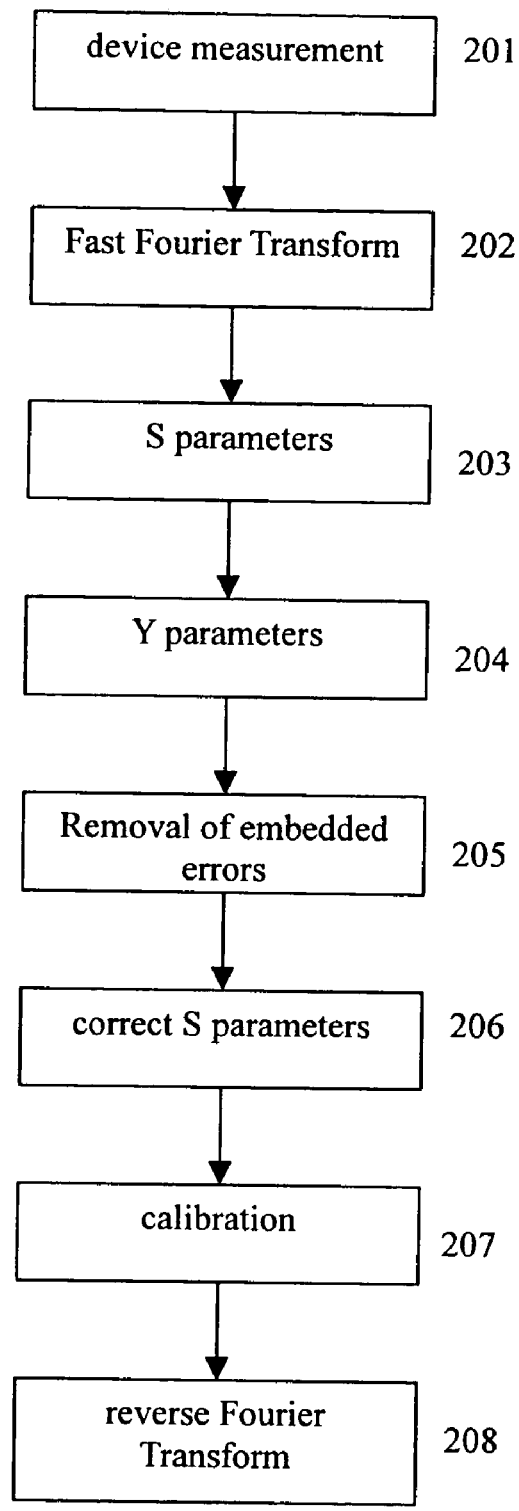
FIG. 2 shows the flowchart of the calibration process of the calibration module of this invention.

FIG. 2 shows the flowchart of the calibration process of the calibration module 15 of this invention. As shown in this figure, at 201 the device to be tested and several standard devices, including the standard open, short, load and through, are measured, such that the incident signal, the reflected signal and the transmission signal are obtained. At 202 the obtained signals are provided to the signal transform module 14 to conduct fast Fourier transform, to obtain the frequency domain data of these signals. At 203 the calibration module 15 calibrates the signals to obtain their S parameters. Applicable calibrations include those known to the skilled person, such as the one port/two port calibration technology disclosed by L. A. Hayden et al. at "Calibration methods for time domain network analysis" in IEEE Transaction on Microwave Theory and Techniques, Vol. 41, No. 3, pp 415–420, March 1993. Of course, other calibration technologies that are able to remove offsets may be used in this calibration step. After the calibration, the calibrated S parameters of these signals are obtained.

Later at 204 the calibration module 15 removes the embedded errors in the S parameters. In this step, any known technology that is able to de-embed the errors may be used. Applicable technologies include the de-embedding technology disclosed by P. J. van Wijnen et al. at "A new straight-forward calibration and correction procedure for 'on-wafer' high frequency S-parameter measurements (45 MHz–18 GHz)" in IEEE ECTM Proc., 1987, pp. 70–73. Other de-embedding technologies that are able to remove the parasitic effects of the probe pads and other embedded errors may also be used in this invention. After the error correction, the correct Y parameters are obtained. At 205 the obtained Y parameters are used to obtain the correct S parameters. Finally, at 206 the S parameters are used to calibrate the frequency domain data. At 207 the clean frequency domain data are converted by the signal transform module 14 into time domain data using the reverse Fourier transform 208, such that correct time domain measurement data are obtained.

During the calibration procedure, the FFT plays an important role to transfer the measured responses from time domain to frequency domain. However, the FFT cannot be directly used in a duration-unlimited waveform where its initial value is not equal to its final value. In the present invention, the Gans-Nahman method, disclosed in W. L. Gans and N. S. Nahman's "Continuous and discrete Fourier transforms of steplike waveforms" in IEEE Transaction on Instrumentation and Measurement, Vol. IM-31, pp 97–101, June 1982, is applied to make a duration-limited waveform. Of course, other methods that are able to subtract the waveform delayed by one time window from the original waveform may be applied in this invention. In addition, if the conversion is not conducted using FFT, such adjustment is not necessary, although other adjustments may be needed.

The time domain data obtained from the above steps are useful in describing the characteristics of the device being tested. As these data are calibrated and their embedded errors are removed, they provide correct descriptive information of the device being tested.

Figure 3:
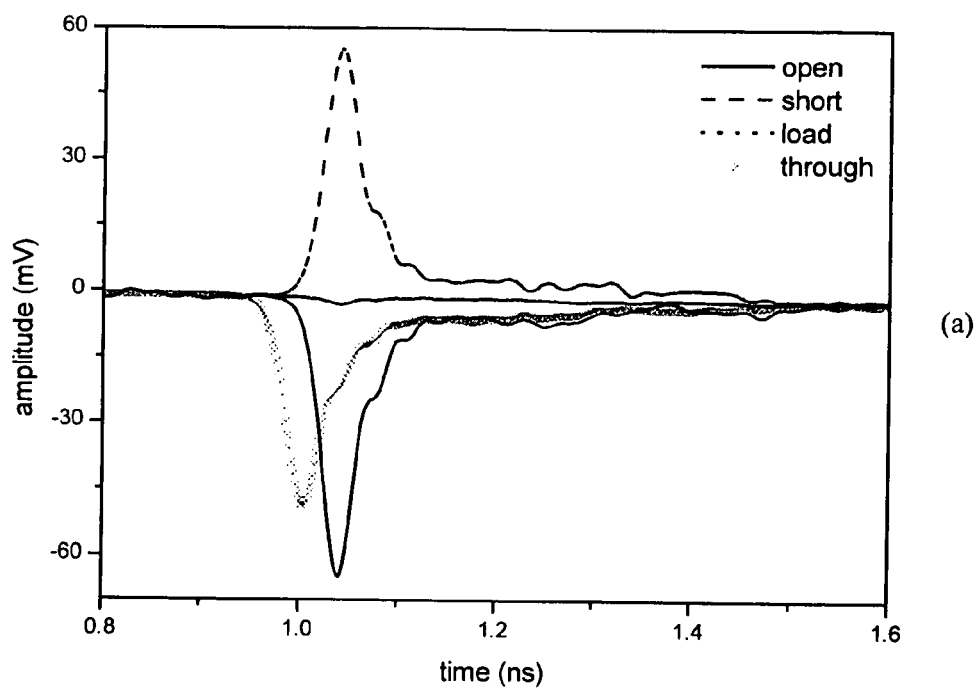
FIG. 3a shows the waveforms of a standard device.
FIG. 3b shows the response waveform of an NMOSFET measured when an ultra short impulse is applied to its gate, before and after calibration.
FIG. 3c shows the response waveform of the NMOSFET of FIG. 3b, measured when an ultra short impulse is applied to its drain, before and after calibration.
Figure 3:
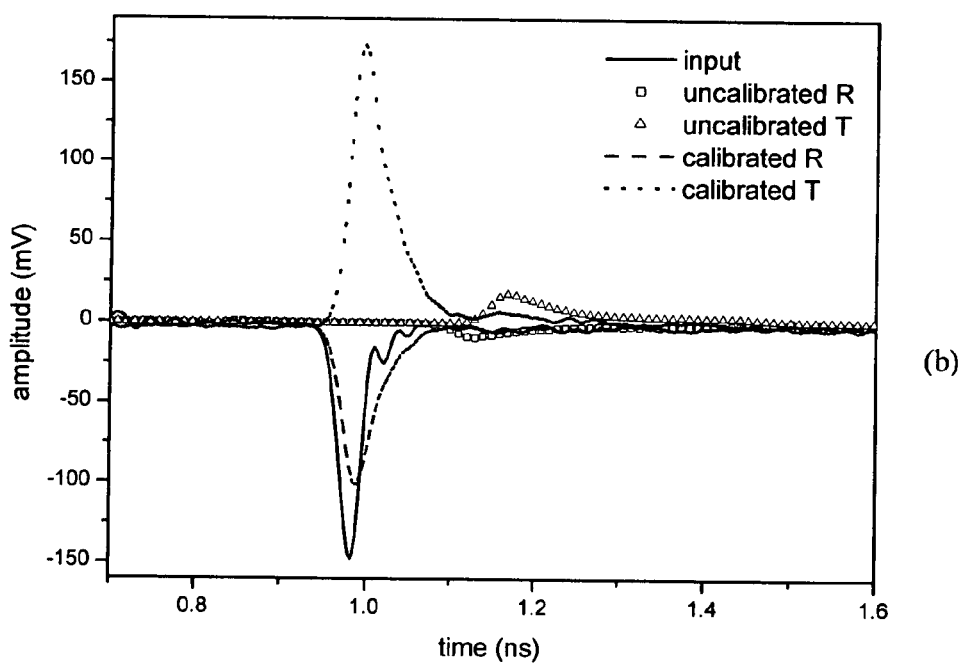
Figure 3:
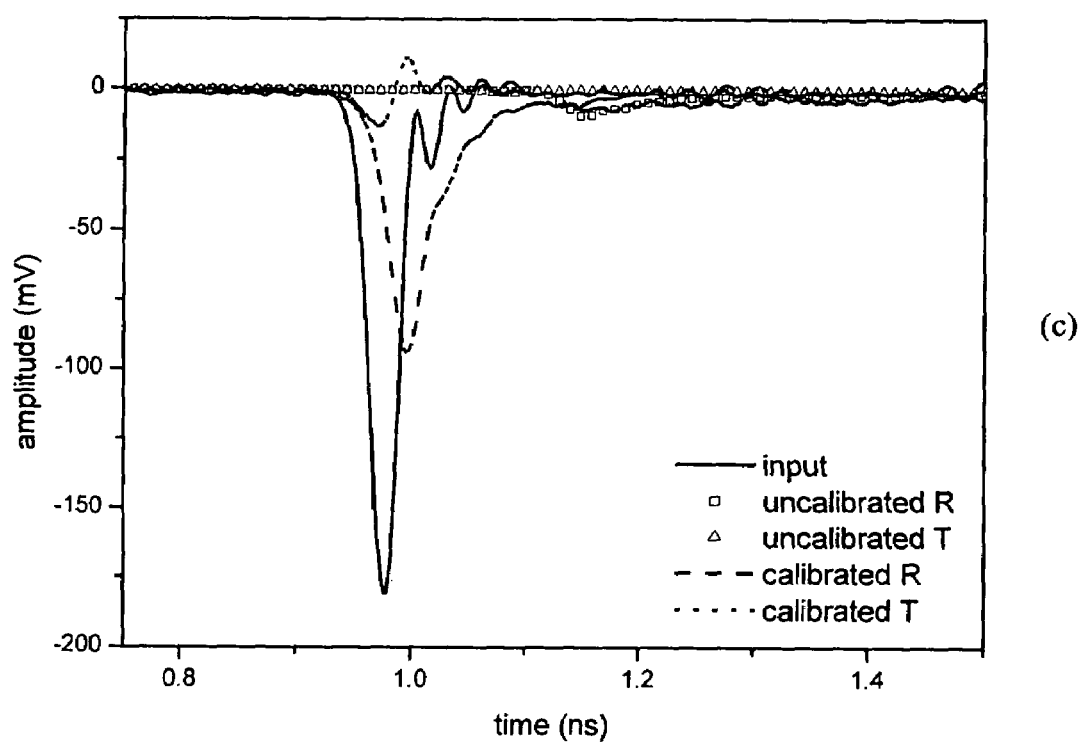

FIG. 3a shows the waveforms of a standard device measured at open, short, load and through. FIG. 3b shows the response waveforms of an NMOSFET (L=0.35 μm, W=100 μm, bias $V_{GS}$=2V, $V_{DS}$=2V) measured when an ultra short impulse is applied to its gate, before and after calibration. FIG. 3c shows the response waveforms of an NMOSFET (L=0.35 μm, W=100 μm, bias $V_{GS}$=2V, $V_{DS}$=2V) measured when an ultra short impulse is applied to its drain, before and after calibration. Both FIGS. 3b and 3c show the waveforms of the incident impulse, the reflected response and the transmitted response. These figures show that the reflected response and the transmitted response are different before calibration and after calibration and that the calibrated waveforms are correct.

After the calibration, the time domain data are used to establish the equivalent model of the device being tested. As described above, the response obtained from applying an ultra short impulse to the device contains sufficient information to describe the behavior of the device. Such descriptive information may be used as bases in modeling the device. In the description of the process of modeling a device, the MOSFET of FIG. 3 will be used as an example.

Figure 4:
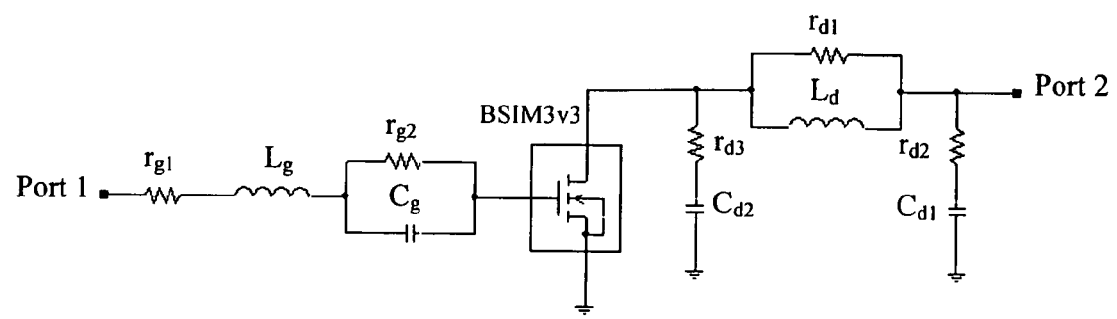
FIG. 4 shows the equivalent circuit diagram of an extended model based on a conventional BSIM3v3 model of MOSFET using the modeling method of this invention.

The MOSFET being modeled may be modeled using the conventional modeling technology, such as the popular BSIM3v3 model. The conventional model may be extended as it is modified using the modeling technology of this invention. FIG. 4 shows the equivalent circuit diagram of an extended model based on a conventional BSIM3v3 model of MOSFET using the modeling method of this invention. As shown in this figure, in order to preserve the DC operating points derived from the BSIM3v3 model 410 and to meet the wideband requirements of the MOSFET device, the BSIM3v3 model 410 is not modified but is simply extended. Also as shown in this figure, the $L_d$ 42 is shunted with rd1 43 for DC bypass and Drain reflection delay and shape adjustment. The $C_{d1}$ 44 is seriated to $r_{d2}$ 45 for DC block, Drain reflection amplitude and damping adjustment. Similarly, the $C_{d2}$ 46 is seriated to $r_{d3}$ 47 for DC block and Drain reflection amplitude adjustment. However, the $C_{d2}$ 46 is much larger than $C_{d1}$ 44 for isolating its influence on Drain reflection damping. In addition, the product of $r_{d2}$ 46 and $C_{d1}$ 44 is smaller than that of $r_{d3}$ 47 and $C_{d2}$ 46 due to separating the influence on Drain reflection amplitude in the initial and peak regimes. On the gate side, however, the model structure is unnecessary to take the DC consideration into account since the DC gate current is almost zero. Thus the $C_g$ 48 is seriated to the gate terminal of BSIM3v3 41 for reducing the effective gate capacitance, and the $r_{g2}$ 49 is shunted to $C_g$ 48 for DC path and Gate reflection delay adjustment. In addition, the $L_g$ 4a is seriated to $r_{g1}$ 4b for Gate reflection damping correction. Meanwhile, the $r_{g2}$ 49 and $C_g$ 48 are seriated to $r_{g1}$ 4b and $L_g$ 4a for wideband consideration, since $L_g$ 4a is almost short at low frequency and $C_g$ 48 is short at high frequency. On the other hand, the magnitude of gate transmission is increased as $r_{g1}$ 4b or $r_{g2}$ 49 is decreased.

Figure 5:
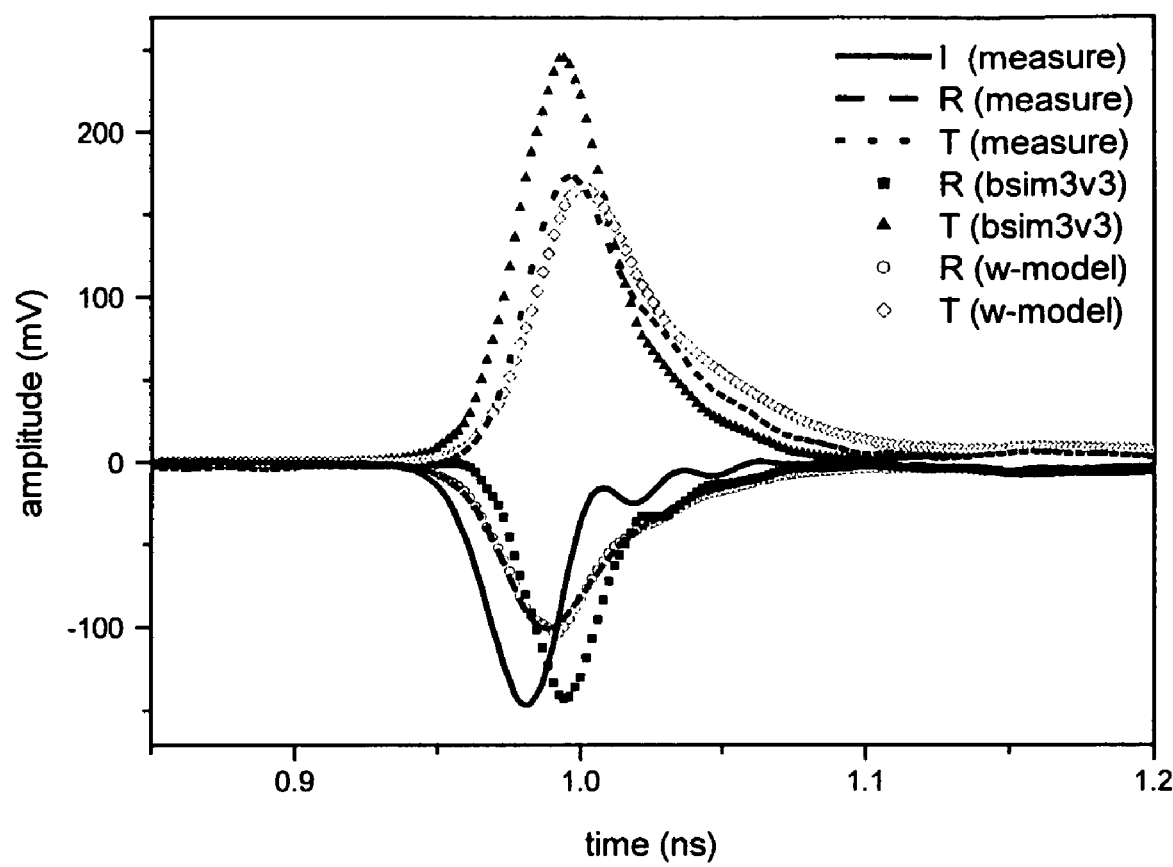
FIG. 5 shows the response waveforms of the MOSFET of FIG. 3, as measured from its gate and simulated using the invented extension model and the conventional BSIM3v3 model, respectively.
Figure 6:
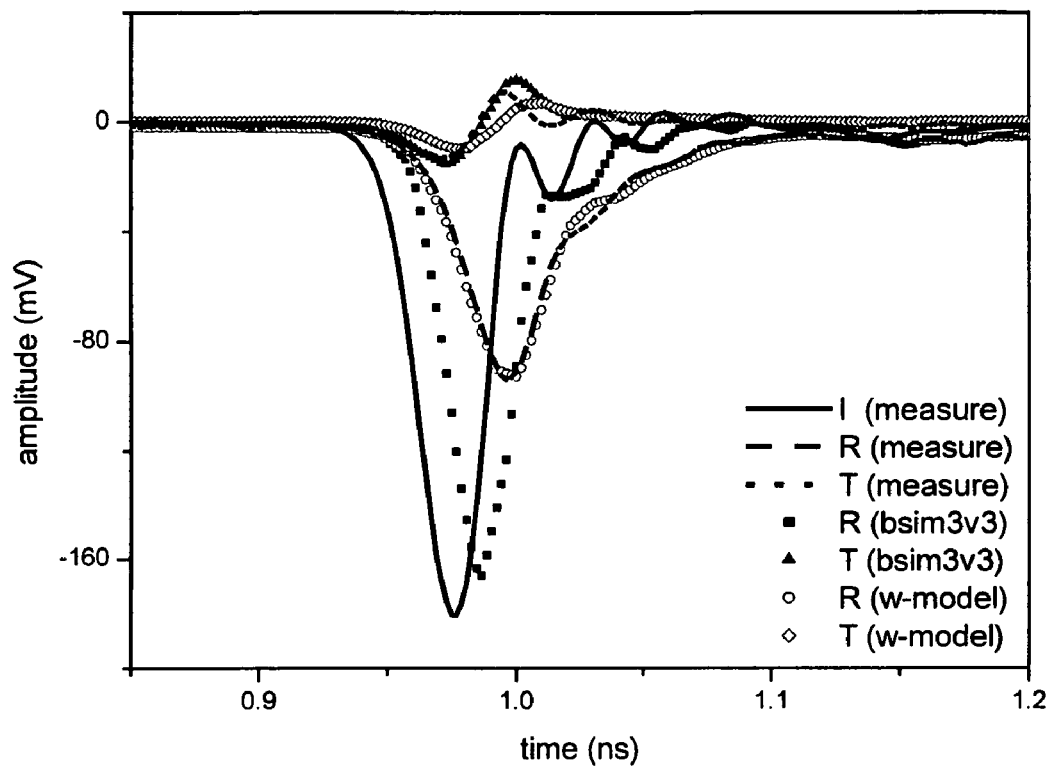
FIG. 6 shows the response waveforms of the MOSFET of FIG. 3, as measured from its drain and simulated using the invented extension model and the conventional BSIM3v3 model, respectively.

The extended model of FIG. 4 is simulated in a simulation system. FIG. 5 shows the response waveforms of the MOSFET of FIG. 3, as measured from its gate and simulated using the invented extension model and the conventional BSIM3v3 model, respectively. FIG. 6 shows its response waveforms as measured from its drain and simulated using the invented extension model and the conventional BSIM3v3 model, respectively. These figures show that the waveforms of the invented extension model are very close to those of the measured waveforms.

Figure 7:
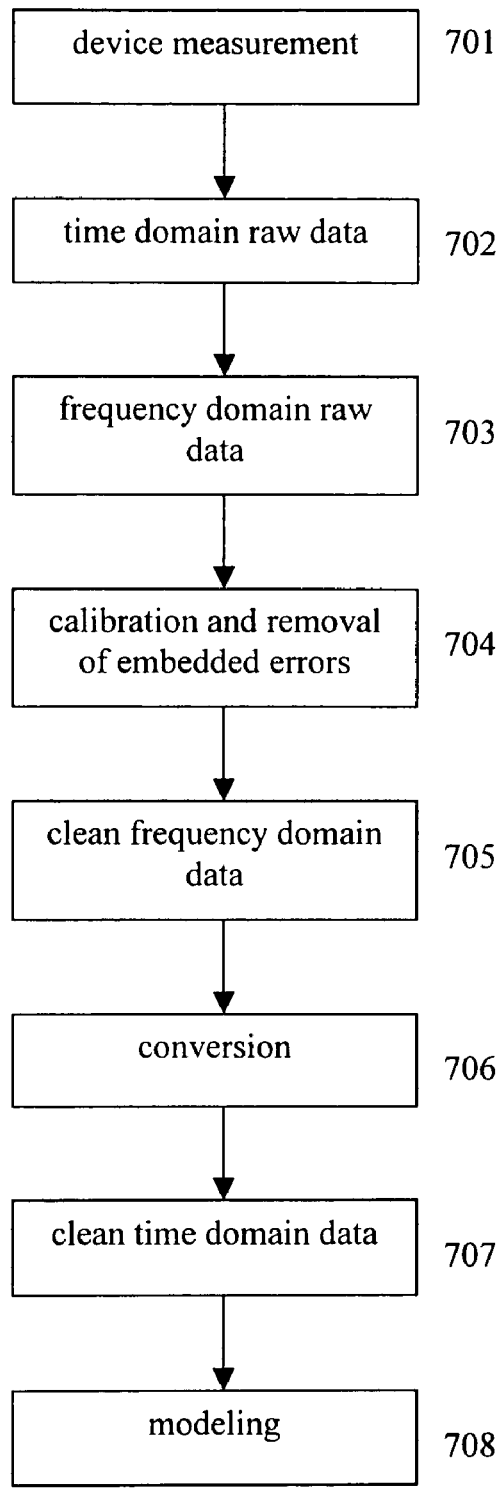
FIG. 7 shows the flowchart of the wideband device measurement and modeling method of this invention.

As described above, the wideband device measurement and modeling method of this invention is as shown in FIG. 7 and comprises the following steps: At 701 a device is measured and at 702 a set of raw data in the time domain representing its characteristics is obtained. At 703 the time domain raw data are converted into frequency domain data. At 704 the frequency domain data are calibrated and their embedded errors are removed and at 705 clean frequency domain data are obtained. At 706 the frequency domain data are converted into time domain data and at 707 clean time domain data are obtained. At 708 equivalent model of the device is established using the clean time domain data, if modeling of the device is needed. In the present invention, the time domain raw data are obtained by applying an ultra short impulse to the device and measuring the incident impulse itself and the transmitted response and the reflected response from the device. In addition, the conversion between the time domain and the frequency domain may be conducted using the Fourier transform technology.

The invented system and method may be used to measure and to model all kinds of devices, including passive devices such as resistor, inductor, capacitor, transmission line or even IC packaging, active devices, such as MOSFET, BJT, HBT or diode, and combinations of such devices. The invention may also be used to modify models established pursuant to other modeling technologies. Users are allowed to measure or model devices using the present invention without the need to purchase specially designed or expensive equipments or instruments.

Besides, the ultra short impulse used to measure the device may also be a pulse, i.e., a step waveform. Similar results will be obtained using a pulse to replace the impulse.

As the present invention has been shown and described with reference to preferred embodiments thereof, those skilled in the art will recognize that the above and other changes may be made therein without departing from the spirit and scope of the invention.

What is claimed is:

1. A method for wideband measurement of an electronic device, comprising the steps of:

measurement of an electronic device to obtain a set of time domain raw data representing electrical characteristics of said device;

conversion of said time domain raw data into frequency domain raw data using a Fourier transform;

calibration and correction of embedded errors according to said frequency domain raw data to obtain clean frequency domain data representing electrical characteristics of said device;
conversion of said clean frequency domain data into clean time domain data; and
outputting said clean time domain data representing electrical characteristics of said device to an output means;
wherein said time domain raw data are obtained by applying to said device an ultra short impulse and measuring said impulse and its response from said device.

2. The wideband measurement method according to claim 1, wherein duration of said ultra short impulse is less than 100 picoseconds.

3. The wideband measurement method according to claim 2, wherein duration of said ultra short impulse is less than 30 picoseconds.

4. The wideband measurement method according to claim 1, wherein said signal pickup means measures said device and at least one standard device, including standard open, short, load and through, to obtain data representing said incident impulse, said reflected response and said transmitted response.

5. The wideband measurement method according to claim 1, wherein said calibration module calibrates said frequency domain data comprising the following steps:
calibrating said frequency domain data to obtain S parameters;
converting said S parameters to obtain Y parameters;
removing embedded errors from said Y parameters;
converting said Y parameter to obtain S parameters; and
obtaining said frequency domain data using said S parameters.

6. A method for modeling of an electronic device, comprising the steps of:
measurement of an electronic device to obtain a set of time domain raw data representing electrical characteristics of said device;
conversion of said time domain raw data into frequency domain raw data using a Fourier transform;
calibration and correction of embedded errors according to said frequency domain raw data to obtain clean frequency domain data representing electrical characteristics of said device;
conversion of said clean frequency domain data into clean time domain data;
establishment of an equivalent model of said device according to said clean time domain data; and
outputting the equivalent model of said device to an output means;
wherein said time domain raw data are obtained by applying to said device an ultra short impulse and measuring said impulse and its response from said device.

7. The modeling method according to claim 6, wherein duration of said ultra short impulse is less than 100 picoseconds.

8. The modeling method according to claim 7, wherein duration of said ultra short impulse is less than 30 picoseconds.

9. The modeling method according to claim 6, wherein said signal pickup means measures said device and at least one standard device, including standard open, short, load and through, to obtain data representing said incident impulse, said reflected response and said transmitted response.

10. The modeling method according to claim 6, wherein said calibration module calibrates said frequency domain data comprising the following steps:
calibrating said frequency domain data to obtain S parameters;
converting said S parameters to obtain Y parameters;
removing embedded errors from said Y parameters;
converting said Y parameter to obtain S parameters; and
obtaining said frequency domain data using said S parameters.

11. The modeling method according to claim 6, wherein said step of establishment of equivalent model comprises establishment of extended model using a conventional core model.

12. The modeling method according to claim 11, wherein said conventional core model comprises a BSIM model, a Gummel Poon model or a U model.

* * * * *